United States Patent
Nguyen

(10) Patent No.: US 6,689,220 B1
(45) Date of Patent: Feb. 10, 2004

(54) PLASMA ENHANCED PULSED LAYER DEPOSITION

(75) Inventor: Tue Nguyen, Fremont, CA (US)

(73) Assignee: Simplus Systems Corporation, Fremont, CA (US)

( * ) Notice: Subject to any disclaimer, the term of this patent is extended or adjusted under 35 U.S.C. 154(b) by 0 days.

(21) Appl. No.: 09/721,162

(22) Filed: Nov. 22, 2000

(51) Int. Cl.$^7$ .............................................. C23C 16/00
(52) U.S. Cl. .................... 118/695; 118/698; 118/723 I; 118/723 E; 118/723 MW
(58) Field of Search ................. 118/723 I, 723 MW, 118/723 E, 695, 698, 697; 156/345.48, 345.41, 345.43, 345.47, 345.33, 345.24

(56) References Cited

U.S. PATENT DOCUMENTS

| | | | | |
|---|---|---|---|---|
| 5,514,603 A | * | 5/1996 | Sato ............................ | 438/105 |
| 5,928,528 A | * | 7/1999 | Kubota et al. ................ | 216/67 |
| 5,983,828 A | * | 11/1999 | Savas ......................... | 118/723 I |
| 6,070,551 A | * | 6/2000 | Li et al. ..................... | 118/723 I |
| 6,132,552 A | * | 10/2000 | Donohoe et al. ......... | 156/345.33 |

* cited by examiner

Primary Examiner—P. Hassanzadeh
(74) Attorney, Agent, or Firm—Tue Nguyen

(57) ABSTRACT

A process system and a deposition method for depositing a highly controlled layered film on a workpiece is disclosed. The basic component of the present invention apparatus is a pulsing plasma source capable of either exciting or not-exciting a first precursor. The pulsing plasma source includes an energy source to generate a plasma, and a plasma adjusting system to cause the plasma to either excite or not-excite a precursor. The precursor could flow continuously (an aspect totally new to ALD), or intermittently (or pulsing, standard ALD operation process). The present invention further provides a method to deposit highly controlled layered film on a workpiece. The method comprises the steps of pulsing the plasma to excite/not-excite the precursors and the ambient to deposit and modify the depositing layers. This procedure then can be repeated alternately until the film reaches a desired thickness.

10 Claims, 15 Drawing Sheets

| | step a | step b |
|---|---|---|
| gas 1 | not excited | excited |
| gas 2 | not excited | not excited |
| gas 3 | excited | excited |
| plasma | off | on |

|  | step a | step b |
|---|---|---|
| gas 1 | not excited | excited |
| gas 2 | not excited | not excited |
| gas 3 | excited | excited |
| plasma | off | on |

Fig. 4

|  | step a | step b | step c | step d |
|---|---|---|---|---|
| gas 1 | flow not excited | flow excited | not flow | not flow |
|  |  |  |  |  |
| ambient | not excited |  | not excited | excited |
|  |  |  |  |  |
| plasma | off | on | off | on |

Fig. 5

PLASMA ENHANCED PULSED LAYER DEPOSITION

FIELD OF THE INVENTION

The present invention relates generally to an apparatus for processing of semiconductor wafers, and more particularly to a system and method for deposition of thin films.

BACKGROUND OF THE INVENTION

A fundamental process in IC fabrication is chemical vapor deposition (CVD), which uses vapor precursors to deposit thin films on a semiconductor substrate. The reactor used for CVD processes includes a precursor delivery system, a substrate and an energy source to decompose the precursor vapor to reactive species to allow a thin film to form on the substrate (CVD process). Effective power sources are heat and plasma energy such as radio frequency (RF) power, microwave energy (MW), low frequency (10 KHz–1 MHz) power, and optical energy (e.g. a laser or ultraviolet light) which decompose the introduced precursors. Plasma energy power is below 6000 W. The amount of power required in each process is determined by the process reaction and a typical power level is between 500–1000 W. Also, the substrate could be biased or heated (to 100° C.–1200° C.) to promote the reaction of the decomposed atoms or molecules and to control the physical properties of the formed films.

Traditionally, precursors used in semiconductor CVD processes are gaseous. An example of a CVD process to deposit silicon dioxide ($SiO_2$) is to use gaseous precursors such as silane gas ($SiH_4$) and oxygen gas ($O_2$):

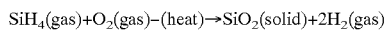
$SiH_4(gas)+O_2(gas)-(heat) \rightarrow SiO_2(solid)+2H_2(gas)$

The basic requirements of a precursor are that the desired product (in this example, $SiO_2$) is solid, and all other products are gases (in this example, $H_2$) to be exhausted away. The energy required for the reaction to take place is the thermal energy, about 400–800° C.

To broaden the processes, more and more liquid and solid precursors have been used, especially in the area of metal-organic chemical vapor deposition (MOCVD). To perform this task, a liquid precursor is typically turned into vapor, and the vapor is then decomposed and reacts on the substrate. A solid precursor must often be dissolved into a solvent to form a liquid precursor. The liquid precursor then needs to be converted into vapor phase before being introduced into the deposition zone. An example of CVD process to deposit copper (Cu) is to use liquid precursor vapor copper HexaFluoroACetylacetone TriMethylVinylSilane (hfac-copper-tmvs, $C_5HO_2F_6$—Cu—$C_5H_{12}Si$):

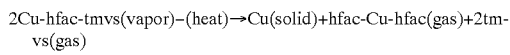
$2Cu\text{-hfac-tmvs(vapor)-(heat)} \rightarrow Cu(solid)+hfac\text{-}Cu\text{-}hfac(gas)+2tm\text{-}vs(gas)$ Another deposition technique is the atomic layer epitaxy (ALE) process. In ALE, the precursors are pulsed sequentially into the ALE process chamber with each precursor taking turn to generate a chemical surface reaction at the substrate surface to grow about one atomic layer of the material on the surface. The growth of one atomic layer in ALE is controlled by a saturating surface reaction between the substrate and each of the precursors. Sometimes a reduction sequence activated with extra energy such as heat or photon can be used to re-establish the surface for a new atomic layer. The fundamental of ALE is having a minimum of two different chemical reactions at the surface with each reaction carefully controlled to generate only one atomic layer. An example of ALE is the growth of ZnS at ~470° C. using sequential flow of elemental zinc and sulfur as precursors as disclosed by Suntola et al., U.S. Pat. No. 4,058, 430. Another example of ALE is the growth of germanium (Ge) on silicon substrate at ~260–270° C. using a first step pulsing of $GeH_4$ vapor flow to generate an atomic layer coverage of $GeH_4$ and a second step pulsing of an Xe lamp exposure to decompose the surface $GeH_4$ as disclosed by Sakuraba et al, J. Cryst. Growth, 115(1–4) (1991) page 79.

ALE process is a special case of atomic layer deposition (ALD) process. The focus of ALE is the deposition of epitaxial layers, meaning perfect crystal structure. In contrast, ALD process seeks to deposit one layer at a time with the focus on film uniformity, not single crystal structure.

The major drawbacks of CVD and ALD processes are the high temperature needed for the chemical reactions and the limited number of available precursors. Each CVD or ALD process always starts with an extensive evaluation of various precursors and their chemical reactions to see if there is any suitable process reaction.

To lower the temperature needed for the chemical reaction, and to further promote possible reaction, plasma energy is being used to excite the precursors before the reaction takes place in CVD processes. Such processes are called plasma enhanced CVD (PECVD) processes. An energy source using radio frequency (RF) power or microwave (MV) power can be used to generate a plasma, which is a mixture of excited gaseous species, to supply energy to the precursors thus promoting the chemical reactions.

However, there is no plasma enhanced ALD process or equipment. The main advantages of a plasma enhanced ALD are the low temperature needed for the reaction to occur, and the addition of plasma energy to excite the precursors, leading to more selections of precursors. Furthermore, a plasma treatment could modify the surface condition, leading also to a wider range of precursor selection.

It would be advantageous if there is a plasma enhanced ALD system.

It would be advantageous if a plasma treatment could be incorporated in an ALD process.

SUMMARY OF THE INVENTION

Accordingly, a plasma enhanced atomic layer deposition (PEALD) apparatus is provided to offer atomic layer deposition capability using plasma source to excite the precursor. In addition to the prior art surface reactions using non plasma-excited precursor, the present invention also offer surface reactions using plasma-excited precursor. With plasma-excited precursor, the surface reaction could be either deposition reaction, or material modification by plasma bombardment.

The basic component of the present invention apparatus is a pulsing plasma source capable of either exciting or not-exciting a first precursor. The pulsing plasma source includes an energy source to generate a plasma, and a plasma adjusting system to cause the plasma to either excite or not-excite a precursor. The precursor could flow continuously (an aspect totally new to ALD), or intermittently (or pulsing, standard ALD operation process).

The plasma power source is preferably an inductive coupled plasma (ICP) source, but any plasma source such as capacitance plasma source, microwave guide plasma source, electron cyclotron resonance plasma source, magnetron plasma source, DC power plasma source, etc. works equally well.

In the simplest design, the plasma adjusting system is a power switch, causing the plasma to either ON or OFF. When the plasma is OFF, the precursor is not excited by the plasma (because there is no plasma). When the plasma is ON, the precursor is excited by the plasma. Typical plasma power when ON is between 15 to 6000 W. The low power is used for sensitive precursors such as those containing organic components. The timing for this design is long, in the order of many seconds because of the needed time for the plasma to stabilize.

To shorten the plasma stabilizing time, the plasma adjusting system comprises a two-level plasma power switch: a low power first level and a high power second level. The first level plasma power generates a plasma, but not enough to excite the precursor, either by low enough power or the precursor is far away from the plasma. The second level plasma power generates a large enough plasma to excite the precursor. By using a first level plasma, the stabilizing time is much shorter because the plasma is already present, and powering up from the first level to the second level power takes shorter time. The first power level is typically from 15 to 300 W and the second power level, from 100 to 6000 W.

Another way to block the plasma is to apply an electric field. The plasma adjusting system then comprises an electrode having a potential. By varying the potential, the plasma could either pass through or be confined. At ground potential, the electrode will terminate the plasma, allowing no plasma to pass through. At a positive potential, the electrode will repel all positive charges in the plasma field, allowing only negative charges such as electrons, to pass through. At floating potential, meaning the electrode is not connected, the electrode will obtain a self-potential, but the plasma will pass through. The electrode could be the workpiece support, or a wire mesh above the workpiece.

The present invention apparatus further comprises a heater source to bring the workpiece to a process temperature.

The present invention apparatus further comprises a second precursor positioned in a way as always not being excited by the plasma, and a third precursor positioned in a way as always being excited by the plasma. These precursors complement the pulsing action of the plasma source on the first precursor for a wider selection of process conditions.

The present invention apparatus further comprises pulsing systems for the first, second and third precursors. The pulsing systems further allow the sequential deposition of these precursors. Together with the pulsed plasma, the pulsed precursors offers more control to the timing of the process. The first, second and third precursors could comprise a plurality of precursors with different pulsing systems. As such, the precursors could pulse together at the same time, pulsed at different times, or pulsed in a synchronized fashion such that when one of the pulsed precursors is on, the others are off.

The present invention further provides a method to deposit atomic layers using plasma enhanced ALD system. The method comprises the steps of a) the plasma does not excite the first precursor flow b) the plasma does excite the first precursor flow with the stepping sequence interchangeable, meaning either a) before b) or b) before a). This procedure can then be repeated alternately until the film reaches a desired thickness.

Generally, step a) deposits a layer of material from the un-excited precursor to the workpiece surface. Step b) could deposit a different layer from the excited precursor to the workpiece surface, or step b) could modify the previously deposited layer with the excited precursor. Therefore, with step b) depositing, the method grows a thin film on a substrate by a) subjecting the substrate to the vapor of the un-excited precursor to form a layer of material on the substrate;

b) subjecting the thus-formed surface to the vapor of the excited precursor to form a different layer of material on the thus-formed surface.

With the step b) modifying, the method grows a thin film by a) subjecting the substrate to the vapor of the un-excited precursor to form a layer of material on the substrate;

b) subjecting the thus-formed surface to the vapor of the excited precursor to modify the material of the deposited layer on the thus-formed surface.

A method in accordance with the present invention also provides for the presence of a second precursor always not-excited and a third precursor always excited. Steps a) and b) then have the second and third precursors together with the first precursor. The addition of the second and the third precursors offer the broadening of the process parameters, thus allow the development of many advanced processes.

The precursor flows in steps a) and b) above can be continuous or intermittent (pulsing). An example of continuous precursor flow is TetraDiMethylAminoTitanium (TDMAT) in a process used to produce TiN film. With low enough substrate temperature, TDMAT precursor does not react at the substrate. With plasma on, TDMAT is decomposed and forms a thin TiN layer. With pulsing plasma, a highly controlled layered TiN film is formed. Adding a continuous flow of non-excited second precursor, nitrogen gas for example, could reduce the TDMAT partial pressure for controlling the deposition rate. Adding a continuous flow of third plasma-excited precursor, nitrogen and hydrogen for example, could change the film composition such as reducing the amount of carbon.

The first, second and third precursors each could comprise a plurality of precursors. With pulsing precursors, meaning a precursor flow is either on or off, a plurality of precursors offer sequential flow. For example, the first of the first precursors could flow, and then stop, then the second of the first precursors could flow, and then stop, and so on, until the last of the first precursors, and then return to the first of the first precursors.

Also, with pulsing precursors, a method in accordance with the present invention includes 2 more steps:

c) when the precursor flow is off, the plasma does not excite the process chamber ambient residue enough to have an effect on the workpiece;

d) when the precursor flow is off, the plasma does excite the process chamber ambient residue enough to have an effect on the workpiece;

with the stepping sequence interchangeable, meaning either c) before d) or d) before c). The stepping sequence between a), b), c) and d) is also interchangeable depending on the process development. The difference between steps c, d and steps a, b is the absence of the precursor flow. Steps a, b occur when there is a precursor flow and steps c, d occur when there is no precursor flow. Without precursor flow, the ambient still has enough residue gaseous particles to sustain a plasma. This plasma, though without active precursor, still has enough energy to have an effect on the deposited film.

With 4 steps, there are 4×3×2×1=24 possible sequences. This procedure can then be repeated alternately until the film reaches a desired thickness.

An example is the sequence a c (a c a c . . . ). This is the prior art ALD process where one of the first precursors flows without being excited by the plasma to form a layer on the workpiece, and then stops, then another of the first precursors flows without being excited by the plasma to form another layer on the previous layer, and then stops, and the sequence continues until the film reaches a desired thickness. A variation of this example is the sequence b c (b c b c . . . ). In this sequence, one of the first precursors flows while being excited by the plasma to form a layer on the workpiece, and then stops, then another of the first precursors flows while being excited by the plasma to form another layer on the previous layer or to modify the material of the previous layer, and then stops, and the sequence continues. A specific example of this sequence is TetraDiMethylAminoTitanium (TDMAT) in a process used to produce TiN film. With plasma on, TDMAT is decomposed and forms a thin TiN layer (step b), then stops (step c). Then plasma-excited nitrogen and hydrogen flow to modify this thin TiN layer (step b) and then stop (step c). The sequence continues until the film reaches a desired thickness.

Another example is the combination of the first two example a c b c (a c b c . . . ). In this sequence, one of the first precursors flows without being excited by the plasma to form a layer on the workpiece, and then stops, then another of the first precursors flows while being excited by the plasma to form another layer on the previous layer or to modify the material of the previous layer, and then stops, and the sequence continues. A specific example of this sequence is TetraDiMethylAminoTitanium (TDMAT) in a process used to produce TiN film. With plasma off, TDMAT is not quite decomposed and a thin layer of TDMAT coats the substrate (step a), then stops (step c). Then plasma-excited nitrogen and hydrogen flow to modify this thin TDMAT layer (step b) and then stop (step c). The sequence continues until the film reaches a desired thickness. A variation of this combination is the sequence b c a c (b c a c . . . ).

Another example is the sequence b c d c (b c d c . . . ). In this sequence, one of the first precursors flows while being excited by the plasma to form a layer on the workpiece, and then stops, then the ambient is excited by the plasma to modify the newly deposit layer, and then stops, and the sequence continues. A specific example of this sequence is TetraDiMethylAminoTitanium (TDMAT) in a process used to produce TiN film. With plasma on, TDMAT is decomposed and forms a thin TiN layer (step b), then stops (step c). Then plasma-excited nitrogen and hydrogen flow to modify this thin TiN layer (step b) and then stop (step c). Then the plasma-excited ambient also modifies this thin TiN layer (step d) and then stop (step c). The sequence continues until the film reaches a desired thickness. A variation of this example is the sequence a c d c (a c d c . . . ). In this sequence, one of the first precursors flows without being excited by the plasma to form a layer on the workpiece, and then stops, then the ambient is excited by the plasma to modify the newly deposit layer, and then stops, and the sequence continues.

Another example is the sequence a b c (a b c . . . ). In this sequence, one of the first precursors flows without being excited by the plasma to form a layer on the workpiece, then this precursor flow while being excited by the plasma to form another layer on the workpiece or to modify the material of the previous layer, and then stop. A variation of this sequence is a b d c (a b d c . . . ). In this sequence, the ambient is excited by the plasma to modify the newly deposit layer before stopping.

Another example is the sequence b a c (b a c . . . ). In this sequence, one of the first precursors flows while being excited by the plasma to form a layer on the workpiece, then this precursor flow without being excited by the plasma to form another layer on the workpiece or to modify the material of the previous layer, and then stop. A variation of this sequence is d b a c (d b a c . . . ). In this sequence, the ambient being excited by the plasma to clean the surface before the precursor flows.

Although a few of the sequences of practicing the method of the invention has been disclosed, it will be appreciated that there are many more sequences and further modifications and variations thereto may be made while keeping within the scope of the invention as defined in the appended claims.

BRIEF DESCRIPTION OF THE DRAWINGS

FIG. 4 shows the characteristic table of step a and step b of the present invention method of deposition.

FIG. 5 shows the characteristic table of step a, step b, step c, and step d of another embodiment of the present invention method of deposition.

FIG. 6 shows the deposited layers of step a.

DETAIL DESCRIPTION

Figure 1:
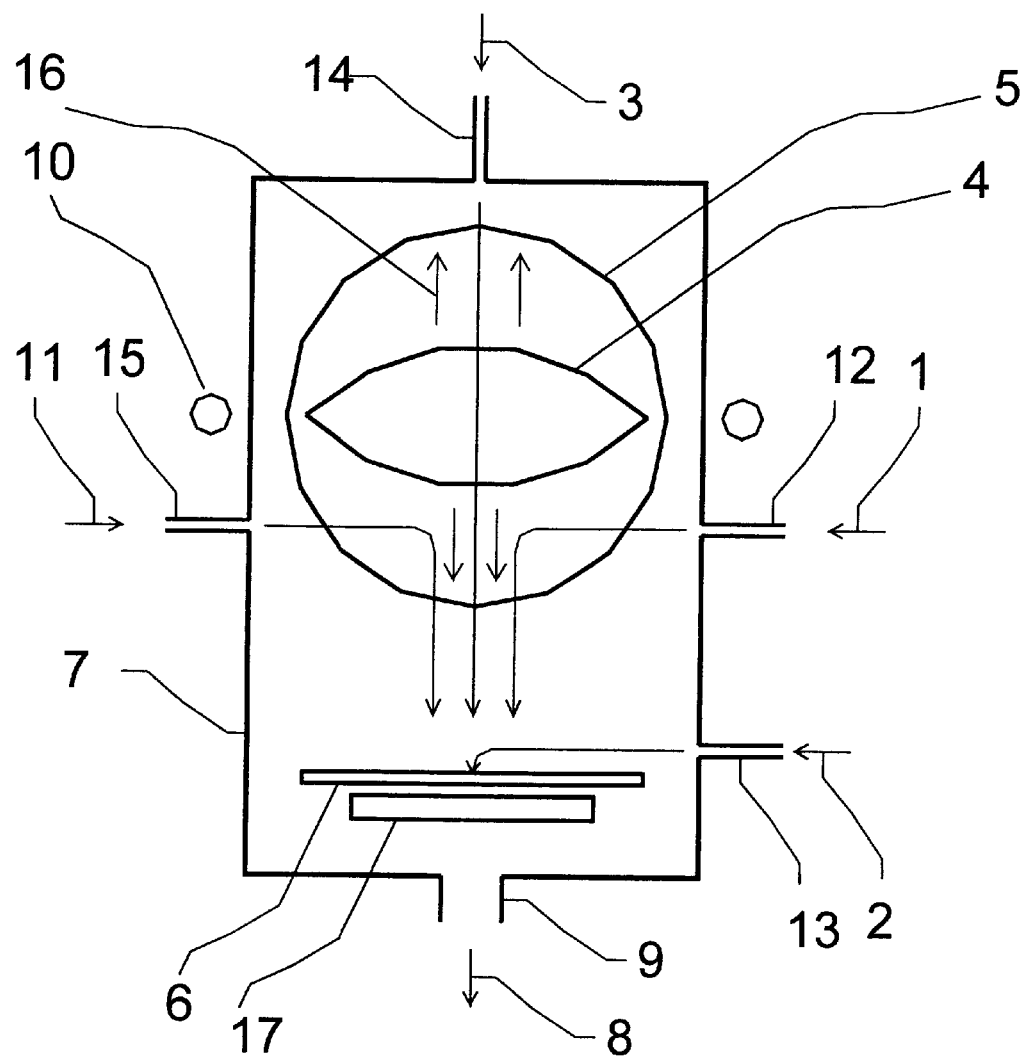
FIG. 1 shows the present invention plasma enhanced atomic layer deposition system.

FIG. 1 shows the present invention plasma enhanced atomic layer deposition system. The system includes a process chamber 7 with a workpiece 6 for deposition of layered films. Heater 17 controls the temperature of the workpiece 6 to the process temperature. An energy source 10 generates a plasma inside the process chamber 7. The plasma is having two stages: 4 and 5. These stages are controlled by a plasma adjusting system (not shown) to increase the plasma from position 4 to position 5 and vice versa. The plasma adjusting system (not shown in figure) in FIG. 1 controls the plasma power, with plasma 4 of less power than plasma 5. By increasing the plasma power, more gas is ionized and the plasma volume increases. The process chamber includes 2 first precursor inlets 12 and 15 having precursor flows 1 and 11 respectively. These first precursors and the plasma source are positioned in such a way that plasma 4 does not excite the precursors 1 and 11. With plasma 5, the precursors 1 and 11 are excited, thus the system uses plasma pulsing to pulse the energy of the precursors 1 and 11. The system further includes a second precursor inlet 13 having precursor flow 2. This precursor 2 is not excited by the plasma because of its position beneath the plasma area. The system further includes a third precursor inlet 14 having precursor flow 3. This precursor 3 is always excited by the plasma because it always passes through the plasma area. An exhaust 9 maintains an exhaust flow 8 to keep the chamber at the desired pressure.

Figure 2:
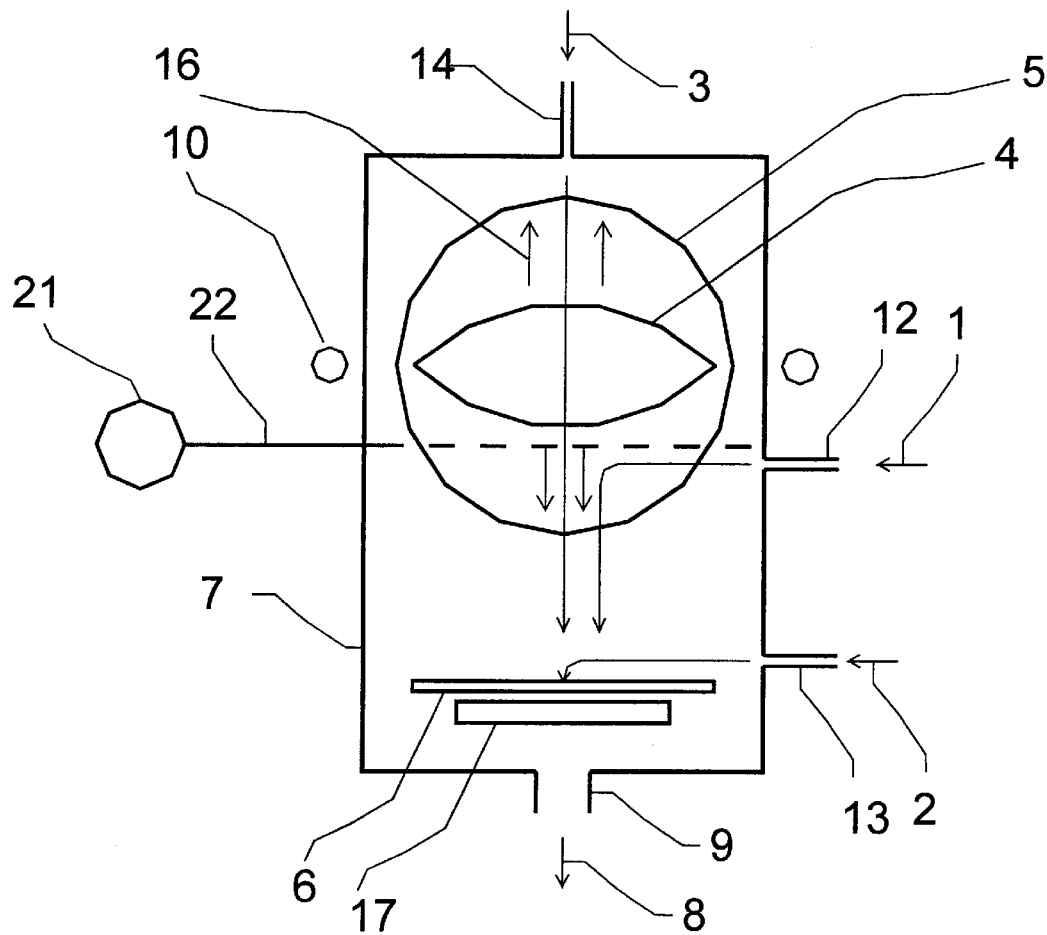
FIG. 2 shows another embodiment of the present invention plasma enhanced atomic layer deposition system.

FIG. 2 shows another embodiment of the plasma enhanced atomic layer deposition system in accordance with the present work. This system used an electrode 22 controlled by a voltage source 21 to adjust the plasma. By grounding the electrode 22, the plasma is terminated at this electrode 22. Leaving the electrode 22 float, the plasma will ignore this electrode and resume its large area.

Figure 3:
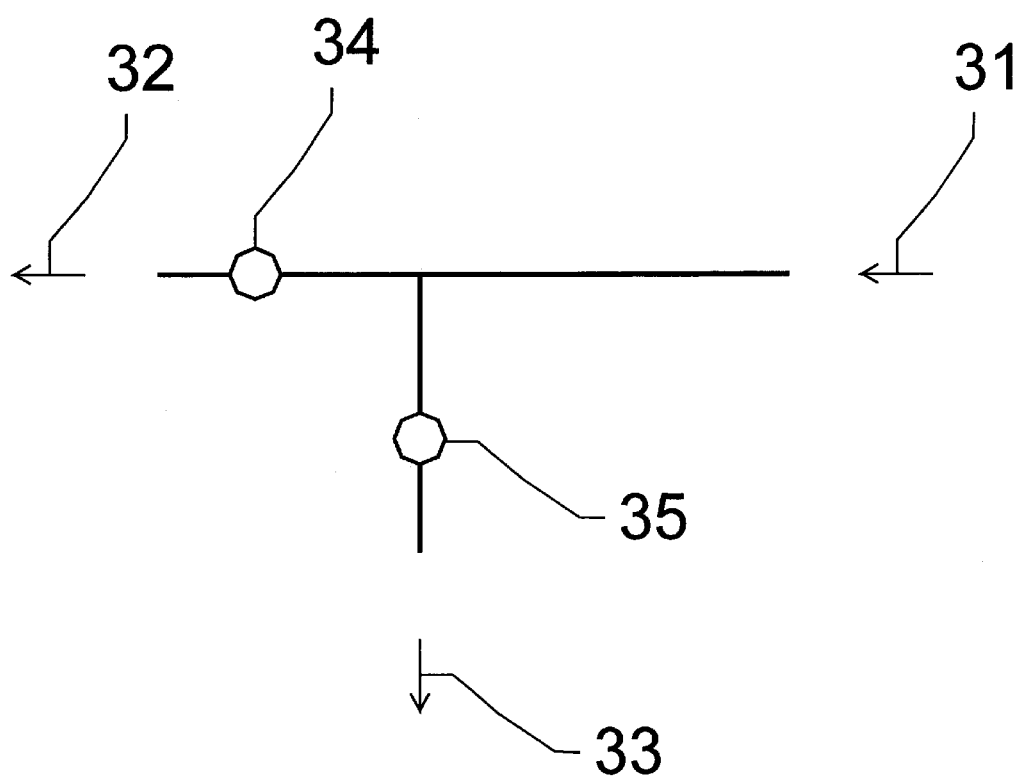
FIG. 3 shows the pulsing manifold of precursor source.

FIG. 3 shows the pulsing manifold of precursor source. Precursor inlet is 31. Chamber inlet is 32 and vacuum pump exhaust is 33. By switching the valves 34 and 35, the precursor flow 31 is effectively being pulsed. When valve 34 open and valve 35 close, the precursor flows into the chamber. When valve 34 close and valve 35 open, the precursor flows to the exhaust. This pulsing manifold allow fast switching of the precursor flow without the need for gas flow stabilization.

The present invention further provides a method to deposit atomic layer using plasma enhanced ALD system. The method comprises the steps of a) the plasma does not excite the first precursor flow b) the plasma does excite the first precursor flow with the stepping sequence interchangeable, meaning either a) before b) or b) before a). This procedure can then be repeated alternately until the film reaches a desired thickness.

Also, with pulsing precursors, a method in accordance with the present invention includes 2 more steps:

c) when the precursor flow is off, the plasma does not excite the process chamber ambient residue enough to have an effect on the workpiece;

d) when the precursor flow is off, the plasma does excite the process chamber ambient residue enough to have an effect on the workpiece;

with the stepping sequence interchangeable, meaning either c) before d) or d) before c). The stepping sequence between a), b), c) and d) is also interchangeable depending on the process development.

FIG. 4 shows the characteristic table of step a and step b of the present invention method of deposition. The first precursor gas 1 is controlled by the plasma position. When the plasma is on, the gas 1 is excited. When the plasma is off, gas 1 is not excited. The second precursor gas 2 is always not excited by the plasma and the third precursor gas 3 is always excited by the plasma.

FIG. 5 shows the characteristic table of step a, step b, step c, and step d of another embodiment the present invention method of deposition. Steps a and b are the same as in FIG. 4, applicable when gas 1 is flowing. When gas 1 is not flowing, the ambient, composed of residue gas, is controlled by the plasma power. The ambient gas is excited by the plasma when the plasma is on. When gas 1 is flowing and the plasma is on, the ambient gas is small compared to gas 1, thus its effect is negligible.

Figure 6:
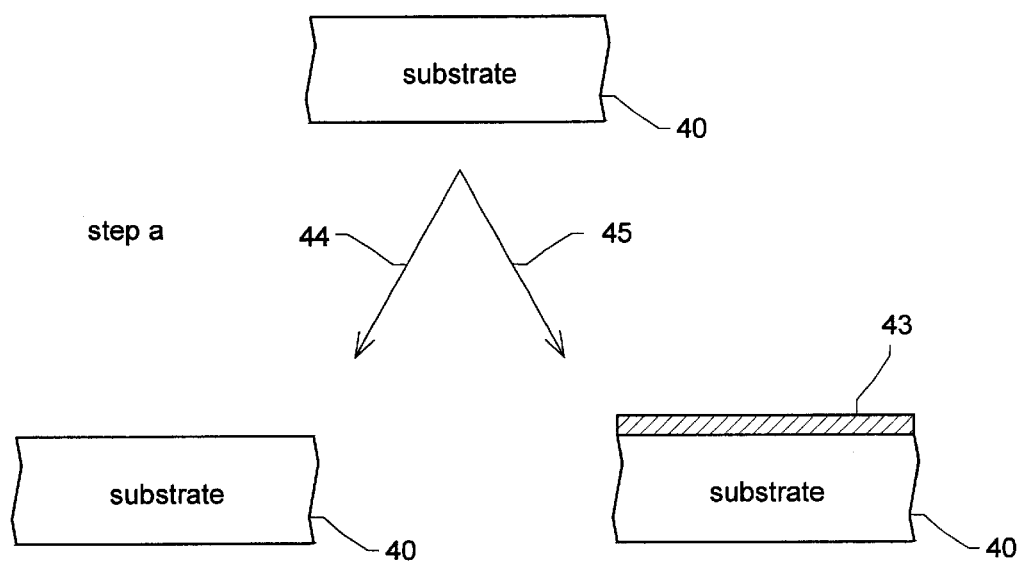

FIG. 6 shows the deposited layers of step a: not-excited gas 1 flows. With certain temperatures, no film is deposited on the substrate 40 (path 44). With the right temperature, a layer 43 is deposited on the substrate 40 (path 45).

Figure 7:
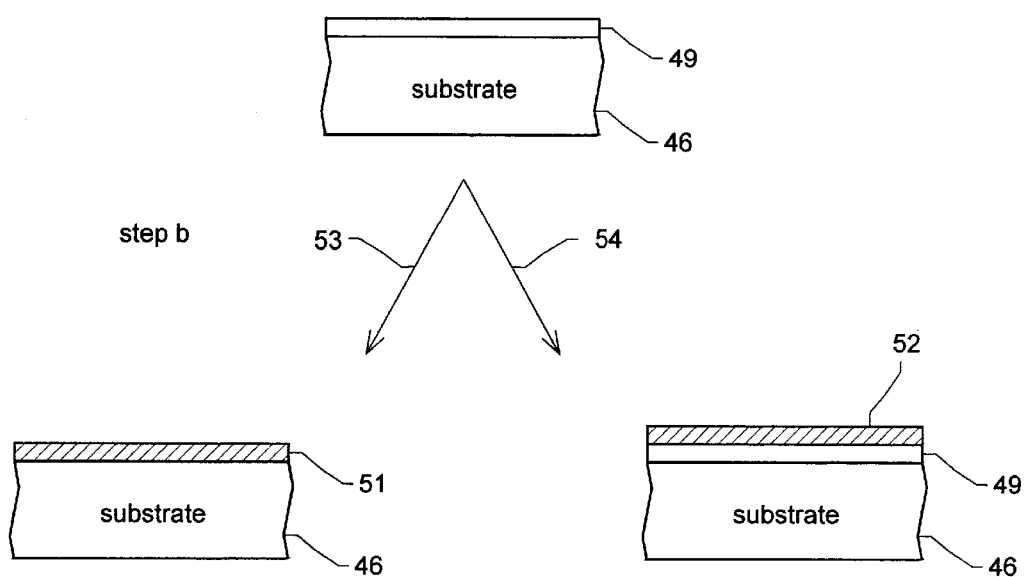
FIG. 7 shows the deposited layers of step b.

FIG. 7 shows the deposited layers of step b: excited gas 1 flow. The excited gas 1 could react with the present layer 49 and converts layer 49 to another layer 51 with different property (path 53). The excited gas 1 could deposit a layer 52 on the existing layer 49 on top of the substrate 46 (path 54).

Figure 8:
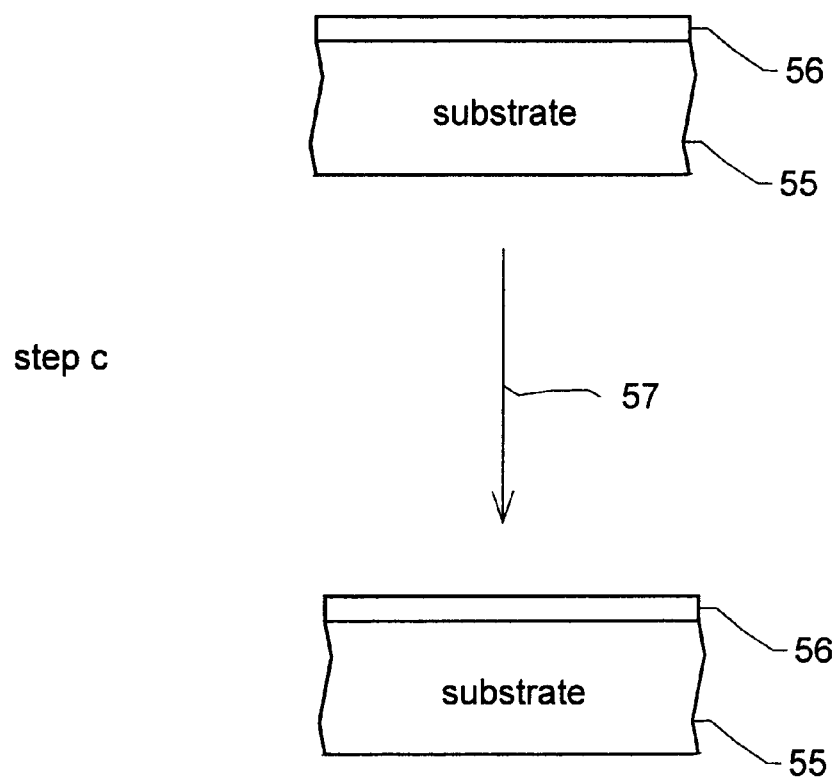
FIG. 8 shows the deposited layers of step c.

FIG. 8 shows the deposited layers of step c: no gas 1 flow and no excited ambient. Nothing happens, layer 56 on substrate 55 is still layer 56 on substrate 55 (path 57).

Figure 9:
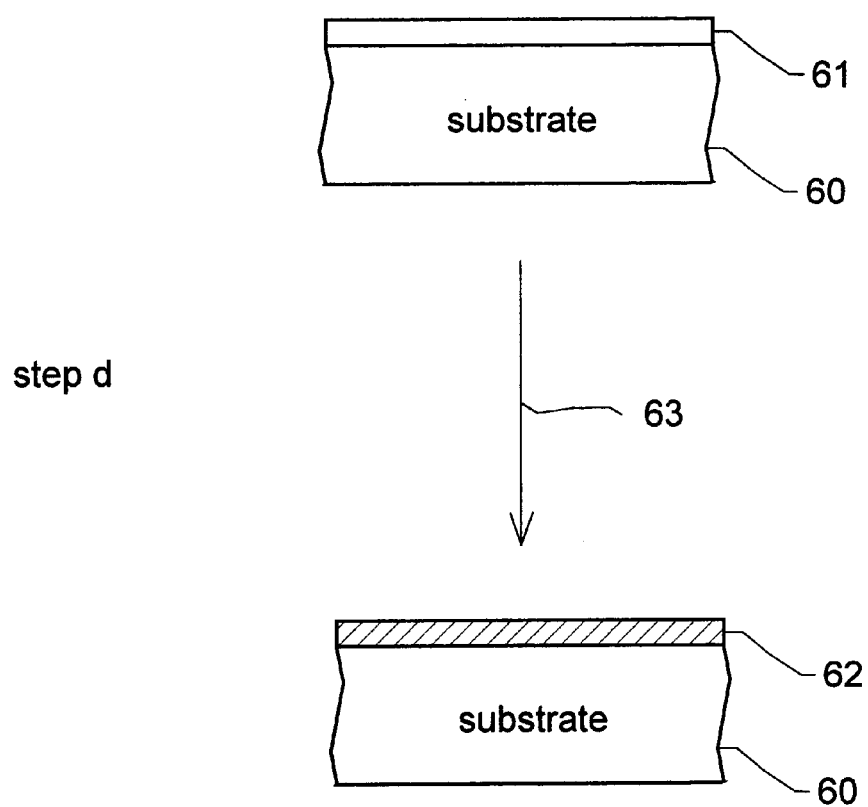
FIG. 9 shows the deposited layers of step d.

FIG. 9 shows the deposited layers of step d: no gas 1 flow and the ambient is excited. The plasma excited ambient reacts with the layer 61 on substrate 60. Layer 61 undergoes reaction to become layer 62 with different property (path 63).

Figure 10:
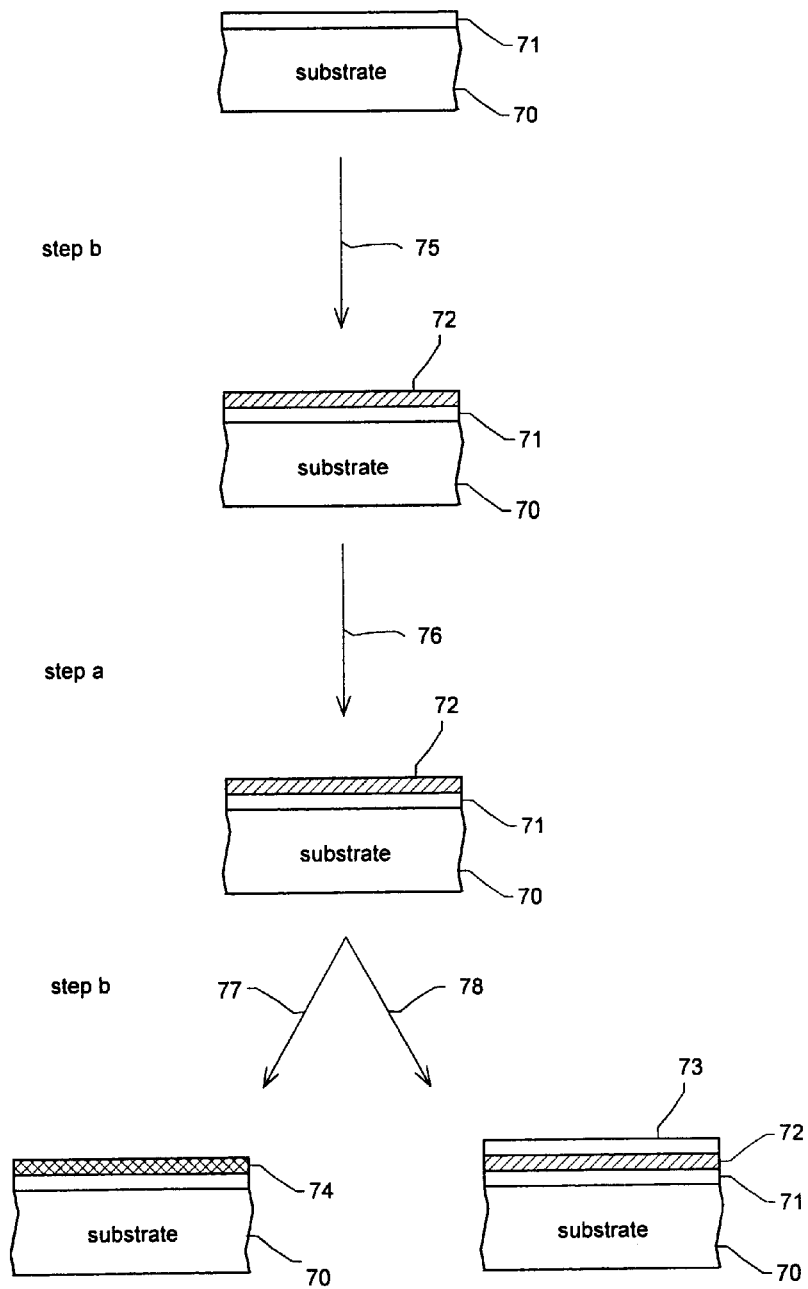
FIG. 10 shows the deposited layers of sequence b a b.

FIG. 10 shows the deposited layers of sequence b a b. The workpiece starts with layer 71 on substrate 70. After step b (path 75), a layer 72 is deposited on layer 71. The temperature is chosen such that no reaction occurs during step a, thus nothing happens to the workpiece (path 76). After another step b, layer 72 could undergo plasma reaction to become layer 74 with different property (path 77), or could have a layer 73 depositing on layer 72 (path 78).

Figure 11:
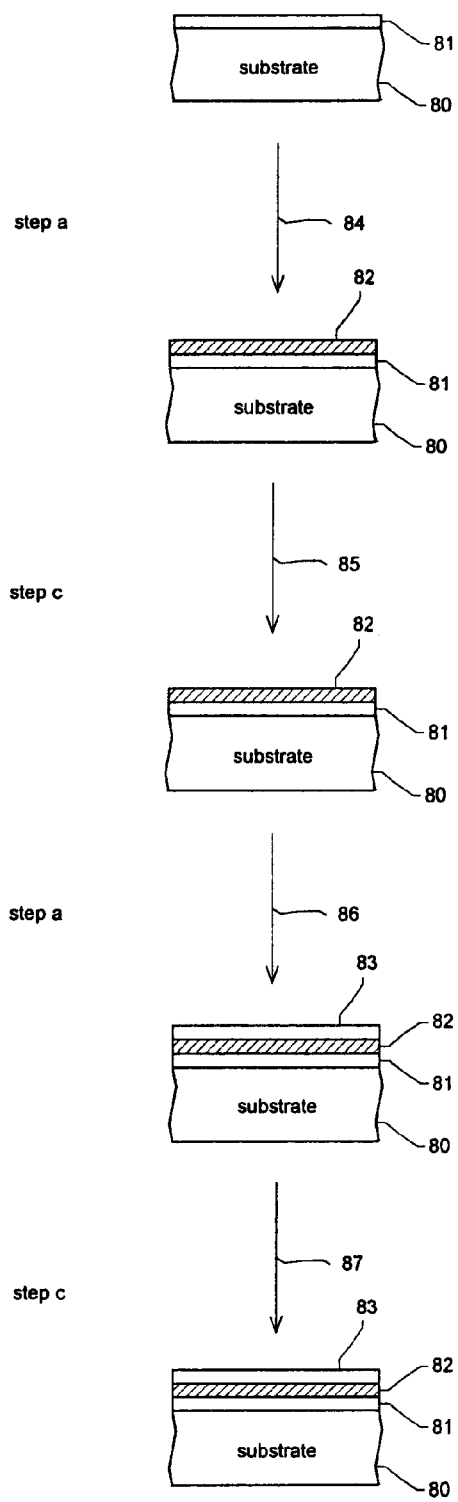
FIG. 11 shows the deposited layers of sequence a c a c.

FIG. 11 shows the deposited layers of sequence a c a c. The workpiece starts with layer 81 on substrate 80. After step a, a layer 82 is deposited on layer 81 (path 84). Step c cleans out the off precursors, thus nothing happens to the workpiece (path 85). Another step a deposits layer 83 on layer 82 (path 86). Step c cleans out the off precursors, thus nothing happens to the workpiece (path 87).

Figure 12:
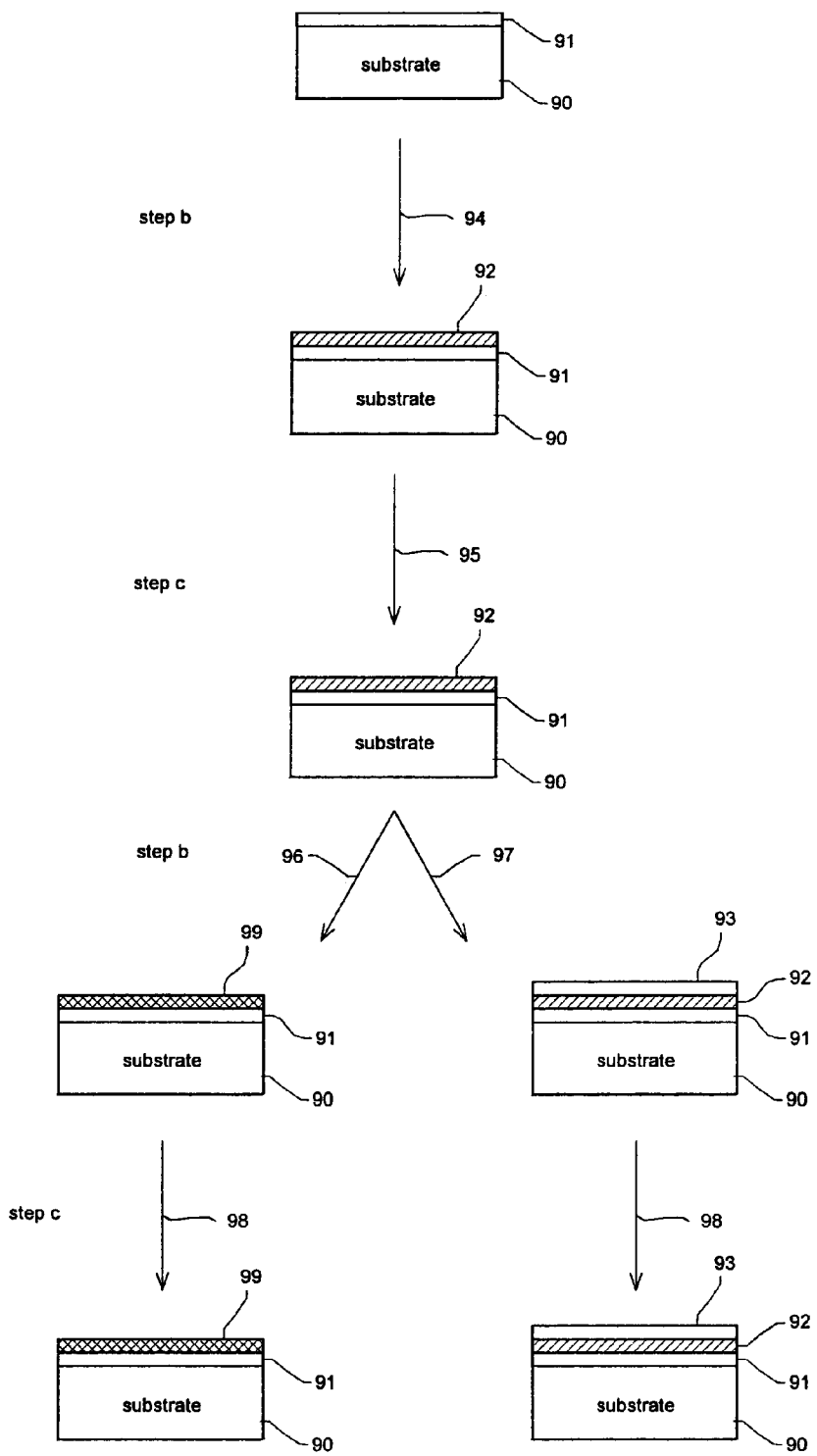
FIG. 12 shows the deposited layers of sequence b c b c.

FIG. 12 shows the deposited layers of sequence b c b c. The workpiece starts with layer 91 on substrate 90. After step b, a layer 92 is deposited on layer 91 (path 94). Step c cleans out the off precursors, thus nothing happens to the workpiece (path 95). Another step b could form a reaction with layer 92 to create layer 99 having different property (path 96) or could deposit layer 93 on layer 92 (path 97). Step c cleans out the off precursors, thus nothing happens to the workpiece (path 98).

Figure 13:
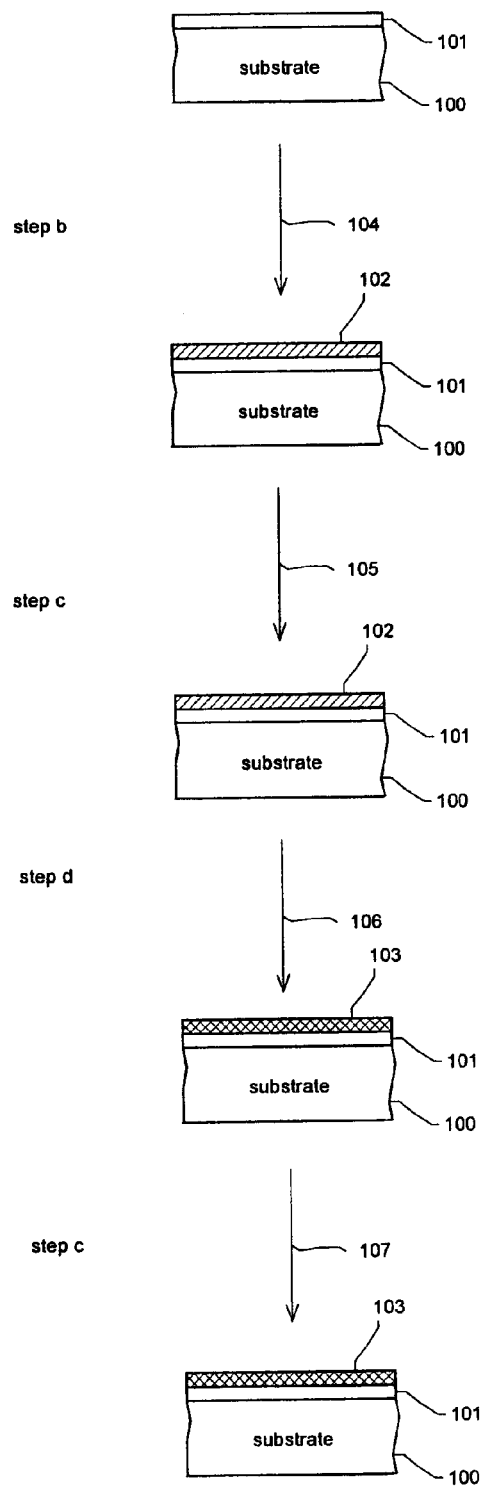
FIG. 13 shows the deposited layers of sequence b c d c.

FIG. 13 shows the deposited layers of sequence b c d c. The workpiece starts with layer 101 on substrate 100. After step b, a layer 102 is deposited on layer 101 (path 104). Step c cleans out the off precursors, thus nothing happens to the workpiece (path 105). Step d forms a reaction with layer 102 to create layer 103 having different property (path 106). Step c cleans out the off precursors, thus nothing happens to the workpiece (path 107).

Figure 14:
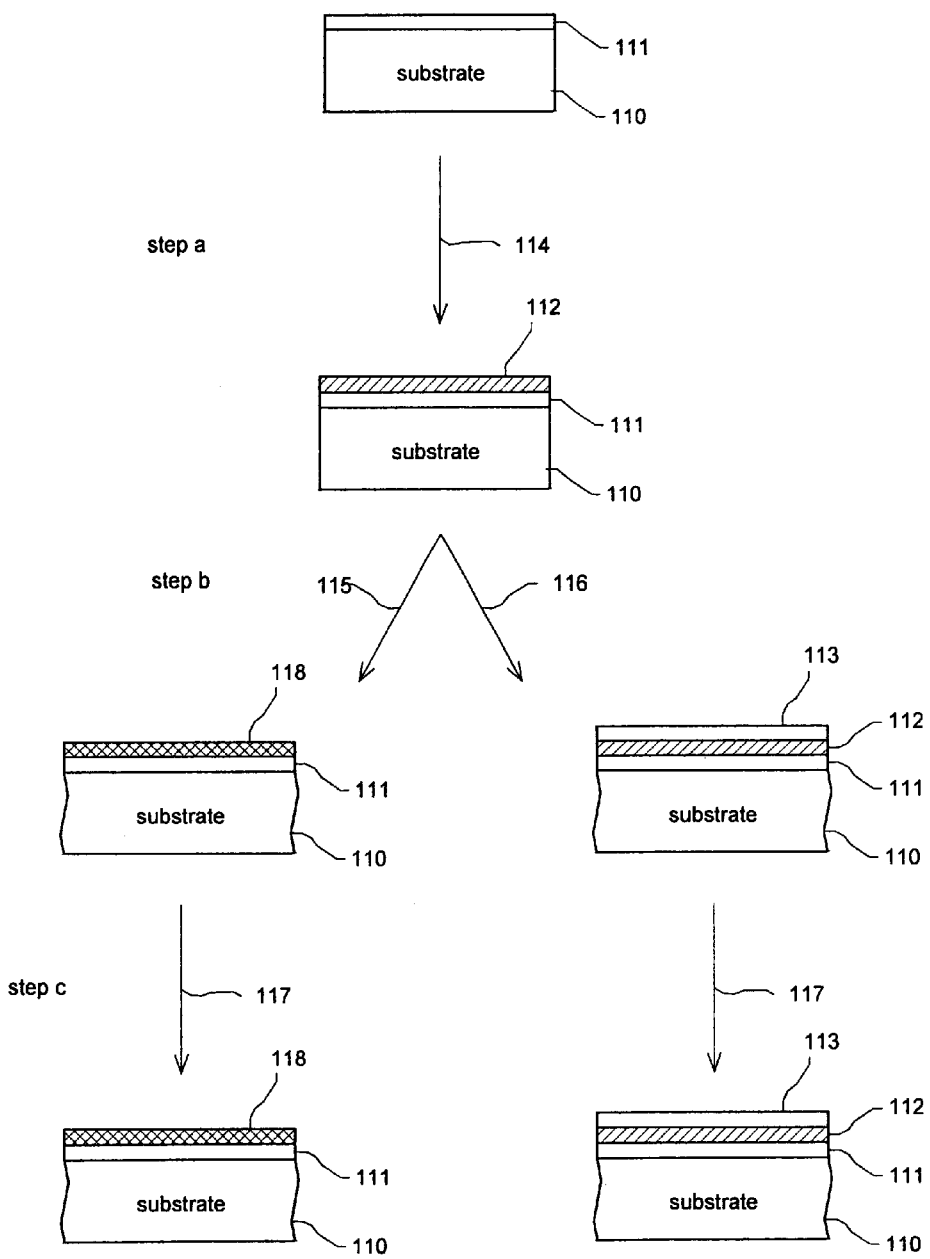
FIG. 14 shows the deposited layers of sequence a b c.

FIG. 14 shows the deposited layers of sequence a b c. The workpiece starts with layer 111 on substrate 110. After step a, a layer 112 is deposited on layer 111 (path 114). A step b could form a reaction with layer 112 to create layer 118 having different property (path 115) or could deposit layer 113 on layer 112 (path 116). Step c cleans out the off precursors, thus nothing happens to the workpiece (path 117).

Figure 15:
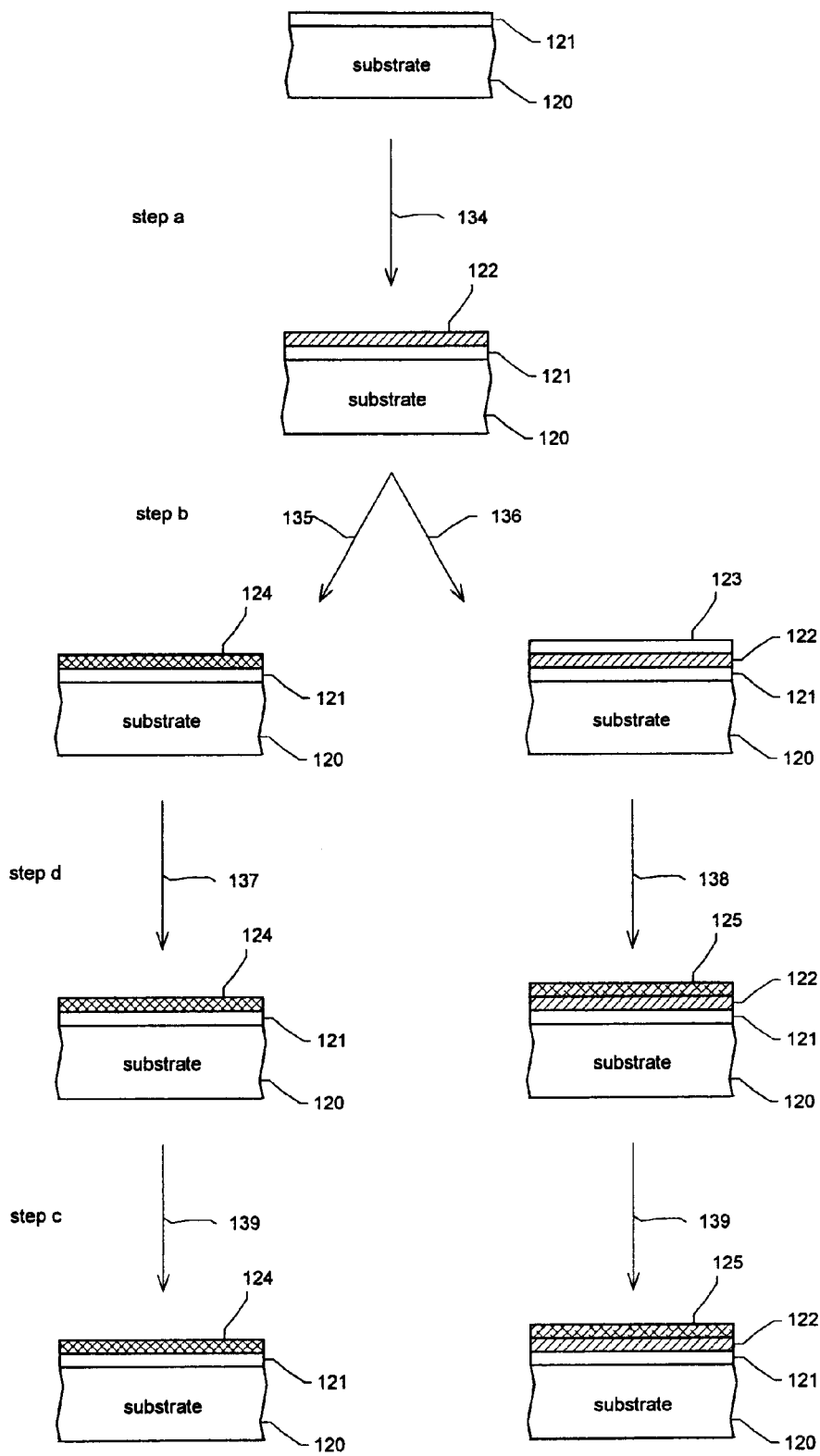
FIG. 15 shows the deposited layers of sequence a b d c.

FIG. 15 shows the deposited layers of sequence a b d c. The workpiece starts with layer 121 on substrate 120. After step a, a layer 122 is deposited on layer 121 (path 134). A step b could form a reaction with layer 122 to create layer 124 having different property (path 135) or could deposits layer 123 on layer 122 (path 136). Step d does not have an effect on layer 124 (path 137) or forms a reaction with layer 123 to create layer 125 having different property (path 138). Step c cleaning out off precursors, thus nothing happens to the workpiece (path 139).

Although a preferred embodiment of practicing the method of the invention has been disclosed, it will be appreciated that further modifications and variations thereto may be made while keeping within the scope of the invention as defined in the appended claims.

What is claimed is:

1. A process system for depositing a highly controlled layered film on a workpiece, the process system comprising:
   a process chamber;
   a workpiece;
   a plurality of first precursor sources coupled to the process chamber for providing a continous flow of at least one precursor therein;
   an energy source coupled to the process chamber for generating a plasma;
   a plasma adjusting system configured to repeat alternately the following sequence
      to turn on the plasma for about one second or longer to excite the precursors from the first precursor sources to promote a plasma-enhanced reaction of the precursors at the workpiece surface, and
      to turn off the plasma for about one second or longer to prevent plasma excitation of the precursors from the first precursor sources, whereby preventing a plasma-enhanced reaction of the precursors at the workpiece surface.

2. The process system of claim 1 wherein the energy source is selected from a group consisting of inductive coupled plasma (ICP) source, capacitance plasma source, microwave guide plasma source, electron cyclotron resonance (ECR) plasma source, magnetron plasma source, DC power plasma source.

3. The process system of claim 1 further includes a heater source to heat the workpiece to a process temperature.

4. The process system of claim 1 further includes a second precursor source for providing at least one precursor to the process chamber, the precursor from the second precursor source being provided only when the plasma is turned off.

5. The process system of claim 1 further includes a third precursor source for providing at least one precursor to the process chamber, the precursor from the third precursor source being provided only when the plasma is turned on.

6. The process system of claim 1 wherein the plasma-on power level is in the range of 15 to 6000 watts.

7. A process system for depositing a highly controlled layered film on a workpiece, the process system comprising:
   a process chamber;
   a workpiece;
   a plurality of first precursor sources coupled to the process chamber for providing a pulsed flow of at least one precursor therein;
   an energy source coupled to the process chamber for generating a plasma;
   a plasma adjusting system configured to repeat alternately the following sequence
      to turn on the plasma for about one second or longer to excite the precursors from the first precursor sources to promote a plasma-enhanced reaction of the precursors at the workpiece surface, and
      to turn off the plasma for about one second or longer to prevent plasma excitation of the precursors from the first precursor sources, whereby preventing a plasma-enhanced reaction of the precursors at the workpiece surface;
   whereby the pulsed flow of the precursors from the first precursor sources is substantially synchronized with the plasma adjusting system so that there is no precursor flow when the plasma is off and there is precursor flow when the plasma is on.

8. The process system of claim 7 wherein the energy source is selected from a group consisting of inductive coupled plasma (ICP) source, capacitance plasma source, microwave guide plasma source, electron cyclotron resonance (ECR) plasma source, magnetron plasma source, DC power plasma source.

9. The process system of claim 7 further includes a heater source to heat the workpiece to a process temperature.

10. The process system of claim 7 further includes a second precursor source for providing a continuous flow of at least one precursor to the process chamber.

* * * * *